United States Patent [19]
Bendorf

[11] Patent Number: 5,176,349
[45] Date of Patent: Jan. 5, 1993

[54] POST RETENTION ARRANGEMENT

[75] Inventor: Robert L. Bendorf, Millerstown, Pa.

[73] Assignee: AMP Incorporated, Harrisburg, Pa.

[21] Appl. No.: 858,837

[22] Filed: Mar. 27, 1992

[51] Int. Cl.$^5$ .............................................. A47K 1/00
[52] U.S. Cl. .................................. 248/220.2; 361/400;
361/419; 403/326
[58] Field of Search ............... 248/222.1, 220.2, 221.3,
248/221.4, 231.9; 361/400, 405, 417, 419;
403/326, 372

[56] References Cited

U.S. PATENT DOCUMENTS

| | | |
|---|---|---|
| 4,457,570 | 7/1984 | Bogese, II . |
| 4,477,142 | 10/1984 | Cooper et al. . |
| 4,618,915 | 10/1986 | Bury ..................................... 361/400 |
| 4,641,901 | 2/1987 | Brennan et al. . |
| 4,703,991 | 11/1987 | Philippson ........................... 439/676 |
| 4,723,059 | 2/1988 | Nelson et al. ........................ 200/277 |
| 4,821,152 | 4/1989 | Lorenzen ......................... 361/417 X |
| 4,841,100 | 6/1989 | Ignasiak ............................ 174/138 G |
| 4,865,555 | 9/1989 | Assini et al. ............................ 439/82 |
| 5,115,379 | 5/1992 | Garay ................................... 361/400 |

OTHER PUBLICATIONS

Abstract Sheet; AMP No. 50048; "Fixing Pin".

Primary Examiner—Ramon O. Ramirez

[57] ABSTRACT

An arrangement for securing a body to a support by means of a post on the body which is inserted into an aperture in the support. The post is formed with a cavity into which there is inserted a resilient retaining member having tapered barbs extending outwardly of the post from opposite sides thereof. When the post is thereafter inserted into the aperture, the retaining member is compressed and the barbs engage the interior walls of the aperture to prevent subsequent removal of the post therefrom.

13 Claims, 3 Drawing Sheets

POST RETENTION ARRANGEMENT

BACKGROUND OF THE INVENTION

This invention relates to the mounting of a body on a support by means of a post on the body which is adapted for insertion into an aperture in the support and, more particularly, to an arrangement for retaining the post within the aperture.

The present invention finds particular utility in the mounting of a connector receptacle block to a printed circuit board. In the past, such mounting has been effected by a variety of arrangements. For example, the connector receptacle block has often been formed with outwardly extending mounting ears having through-bores for accepting threaded mounting bolts which extend through appropriate positioned apertures in the circuit board for securement by nuts on the opposite side of the circuit board. Such an arrangement has an obvious disadvantage in that numerous small parts and a relatively complex assembly operation are required.

Another mounting approach has involved the use of a barbed planar metal insert which extends through, and is captured in, a slot in the connector receptacle body and is then inserted through an appropriate aperture in the circuit board. This arrangement is disadvantageous in some applications because of its limited strength.

A further mounting arrangement utilizes posts which are integrally molded to the plastic connector receptacle body and extend through appropriately located apertures in the circuit board. The ends of the posts extending through the other side of the circuit board are then heat staked to the circuit board. This arrangement is disadvantageous in that the heat required for the heat staking operation crystallizes and degrades the plastic material.

It is therefore an object of the present invention to provide a mounting arrangement of the type described which does not suffer from the disadvantages enumerated above.

SUMMARY OF THE INVENTION

The foregoing, and additional, objects are attained in accordance with the principles of this invention by providing an arrangement for securing a body to a support, wherein the support is formed with an aperture. The inventive arrangement includes a post fixed to the body and adapted for insertion into the support aperture. The post has a major longitudinal axis and is formed with a generally planar cavity along a plane containing the axis, which cavity is open at both ends along a line transverse to the axis. The arrangement further includes a generally planar resilient retaining member which is adapted for containment within the post cavity. The retaining member has a greater dimension than the width of the post so that it extends outwardly beyond both ends of the post cavity. The outwardly extending portions of the retaining member are angled away from the post in a direction opposite to the direction of insertion of the post into the aperture and terminate in sharp corners. The retaining member is also larger than the internal dimension of the aperture and the retaining member is so arranged that when the post is inserted into the aperture the retaining member is resiliently compressed and its outwardly extending sharp corners engage the walls of the aperture to prevent removal of the post therefrom.

In accordance with an aspect of this invention, the retaining member is formed with a notch between the sharp corners to allow compression of the retaining member substantially within its plane.

In accordance with another aspect of this invention, both the cavity and the retaining member are generally U-shaped and are oriented sideways relative to the axis.

BRIEF DESCRIPTION OF THE DRAWINGS

The foregoing will be more readily apparent upon reading the following description in conjunction with the drawings in which like elements in different figures thereof have the same reference numeral and wherein.

DETAILED DESCRIPTION

Figure 1:
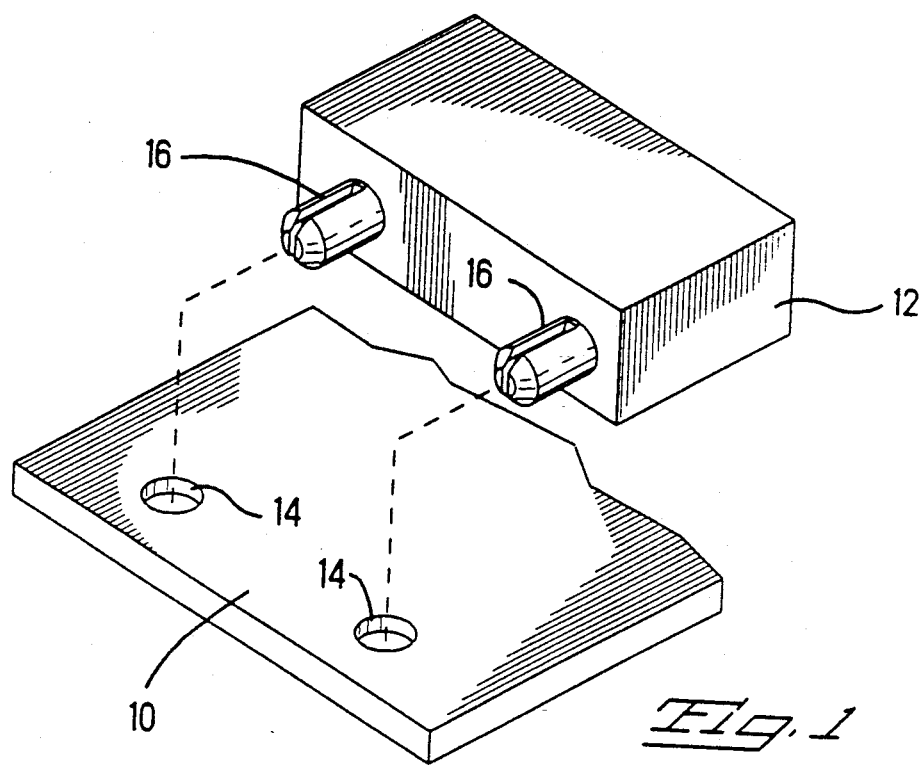
FIG. 1 is an exploded perspective view schematically showing how a connector receptacle block may be secured to a circuit board in accordance with the principles of this invention.
Figure 2:
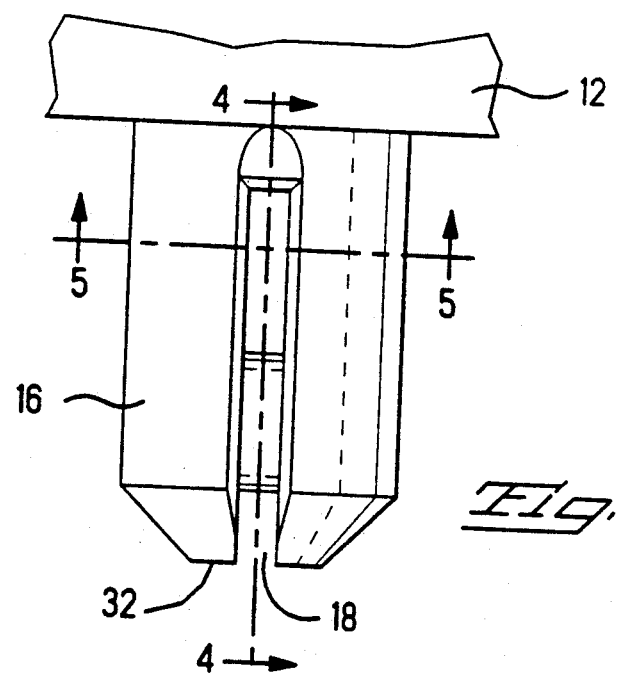
FIG. 2 is an elevational view showing an illustrative post of a securing arrangement according to this invention.

Referring now to the drawings, FIG. 1 illustrates a printed circuit board 10 and a connector receptacle block 12 which is to be mounted to the board 10. While a printed circuit board 10 and a connector receptacle block 12 are specifically illustrated herein, it is understood that the principles of this invention are applicable to other types of supports and bodies, respectively.

As shown in FIG. 1., the board 10 is formed with a pair of apertures 14 and the block 12 is formed with a pair of posts 16. The spacing of the posts 16 matches the spacing of the apertures 14 so that the posts 16 may be inserted into respective ones of the apertures 14 for mounting the block 12 to the board 10. For ease of manufacture, the apertures 14 preferably are circular and the posts 16 are cylindrical, but other shapes are possible. Further, the block 12 and the post 16 preferably are integrally molded of a plastic material.

Figure 5:
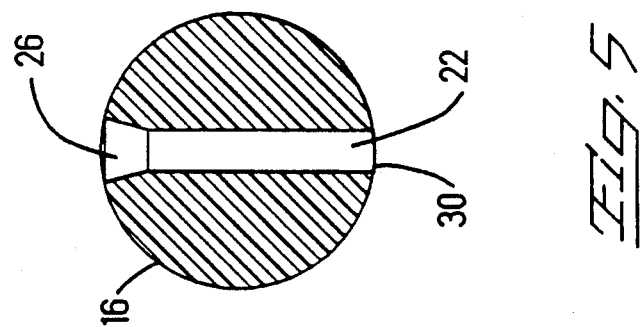
FIG. 5 is a cross sectional view taken along the line 5—5 in FIG. 2.
Figure 4:
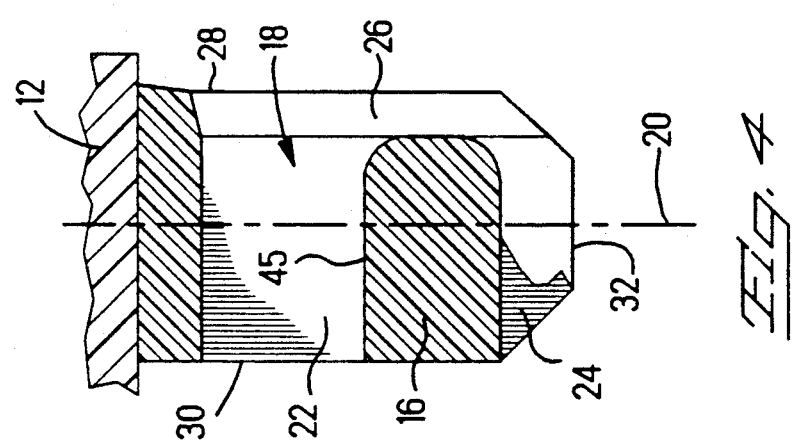
FIG. 4 is a cross sectional view taken along the line 4—4 in FIG. 2.
Figure 3:
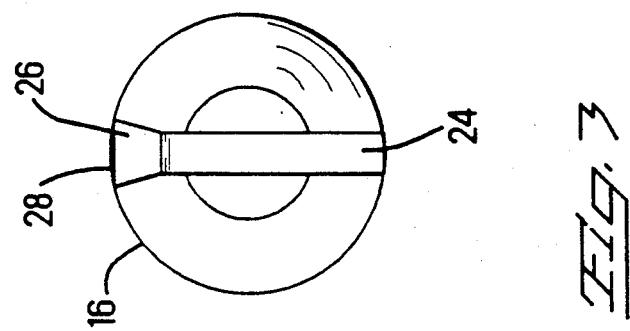
FIG. 3 is a bottom plan view of the post of FIG. 2.

As shown in the drawings, each post 16 is formed with a cavity, designated generally by the reference numeral 18. The post 16 has a major longitudinal axis 20 and the cavity 18 is generally planar along a plane containing the axis 20. Preferably, the cavity 18 is generally U-shaped with a first leg portion 22, a second leg portion 24 and a central connecting portion 26, all within the plane. As shown, the U-shape of the cavity 18 is oriented sideways relative to the axis 20. The central connecting portion 26 is generally parallel to the axis 20 and is open along a wall 28 of the post 16. The first leg portion 22 of the cavity 18 extends through the post 16 across its width and is open at a wall 30 of the post 16 across the axis 20 from the central connecting portion 26. For reasons which will become apparent from the following discussion, the second leg portion 24 of the cavity 18 is preferably open at the end 32 of the post 16 which is remote from the block 12. Further, the central connecting portion 26 of the cavity 18 is formed to taper inwardly from the wall 28 of the post 16, as clearly shown in FIGS. 3 and 5. Finally, the post 16 is preferably tapered at its distal end 32 for ease of insertion into the aperture 14.

In accordance with this invention, there is provided a retaining member, designated generally by the reference numeral 34, adapted for containment within the cavity 18. The retaining member 34 is generally planar and resilient and is preferably formed by being stamped from flat sheet stock metal. As shown in the drawings, the retaining member 34 is shaped complemental to the cavity 18. Thus, the retaining member 34 is preferably generally U-shaped with a first leg portion 36, a second leg portion 38 and a central connecting portion 40. The first leg portion 36 of the retaining member 38 is adapted for insertion into the first leg portion 22 of the cavity 18. Likewise, the second leg portion 38 of the retaining member 34 is adapted for insertion into the second leg portion 24 of the cavity 18. Finally, the central connecting portion 40 of the retaining member 34 is adapted for insertion into the central connecting portion 26 of the cavity 18. The taper of the central connecting portion 26 of the cavity 18 aids in the insertion of the retaining member 34 into the cavity 18.

Figure 7:
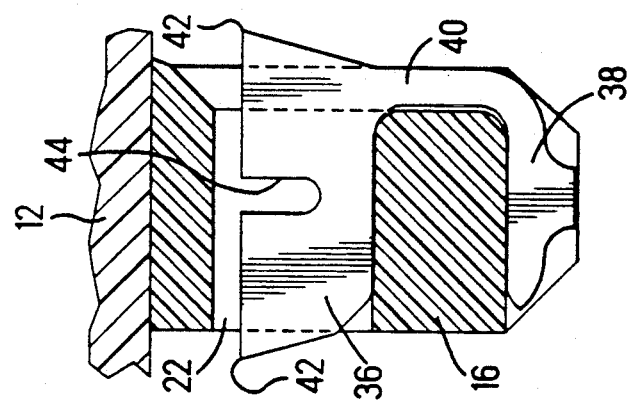
FIG. 7 is a view similar to FIG. 4 showing the retaining member of FIG. 6 installed within the post of FIGS. 2-5.
Figure 6:
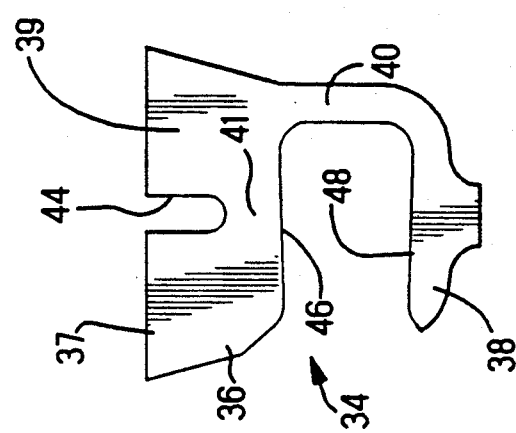
FIG. 6 is an elevational view of an illustrative retaining member according to this invention.

As is clear from FIG. 7, the retaining member 34 is sized so that its first leg portion 36 has a maximum dimension along its length which is greater than the length of the first leg portion 22 of the cavity 18. That is, the length of the first leg portion 36 of the retaining member 34 is greater than the width of the post 16. This dimension of the first leg portion 36 is also greater than the internal diameter of the aperture 14. Thus, when the retaining member 34 is inserted into the cavity 18, the first leg portion 36 extends outwardly beyond the walls 28 and 30 of the post 16. The first leg portion 36 is formed so that those outwardly extending portions are angled away from the post 16 in a direction opposite to the direction in which the post 16 is inserted into the aperture 14, with the outwardly extending portions terminating in sharp corners 42. In effect, the outwardly extending portions of the retaining member 34 function as barbs. The retaining member 34 is further formed with a notch 44 in the first leg portion 36 between the sharp corners 42 thereby resulting in two segments 37 and 39 which are connected together at a resilient neck 41. This notch 44 and resilient neck 41 allow compression of the first leg portion 36 substantially within its plane. The retaining member 34 is dimensioned so that when it is inserted into the cavity 18, there is a tight fit around that part of the post 16 which is between the leg portions 22 and 24 of the cavity 18. Further, the facing edges 46 and 48 of the retaining member leg portions 36 and 38, respectively, are tapered with a smaller spacing therebetween at the open end (the left when viewed in FIG. 6) than at the closed end (the right when viewed in FIG. 6) of the retaining member 34. Thus, when the retaining member 34 is inserted into the cavity 18, its leg portions 36 and 38 are spread apart slightly so that they exert a compressive force to that part of the post 16 which is between the cavity leg portions 22 and 24.

Figure 8:
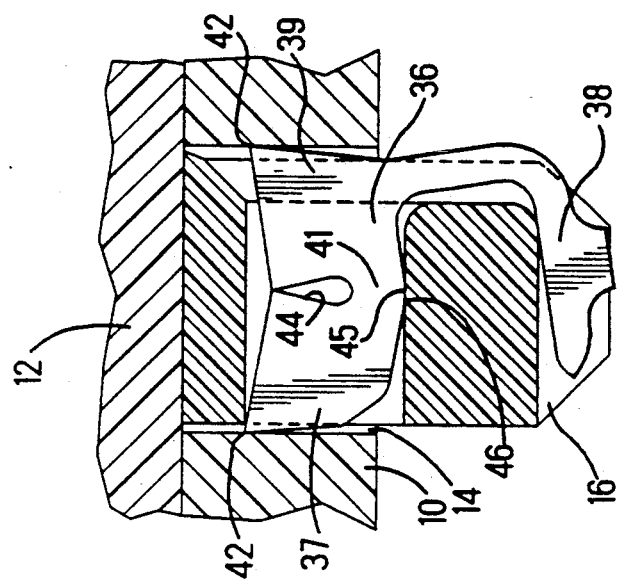
FIG. 8 is a view similar to FIG. 7 showing the post and retaining member inserted in the aperture of the board shown in FIG. 1.

Accordingly, when the post 16, having the retaining member 34 contained within the cavity 18, is inserted into the aperture 14, as shown in FIG. 8 the leg portion 36 of the retaining member 34 is compressed due to the collapse of the notch 44. The resiliency of the metal forming the retaining member 34 opposes this compression and causes the sharp corners 42 to engage the walls of the aperture 14 so as to prevent removal of the post 16 therefrom. Should removal be attempted, the surface 45 of the post 16 urges the edge 46 upwardly causing the two sections 37 and 39 to tend to spread apart and pivot about the neck 41 so that the two corners 42 dig into the wall of the aperture 14. The greater the upward force on the surface 45, the greater the retention force caused by the corners 42.

The aforedescribed arrangement can be used when the aperture 14 in the circuit board 10 is either a plain hole or a plated through-hole. If the aperture 14 is a plain hole, the sharp corners 42 perform the retention function. If the aperture 14 is a plated through-hole, the sharp corners 42 perform an initial retention function and then when wave soldering is performed to the underside of the circuit board 10, the lower leg portion 38 of the retaining member 34, which is exposed through the open cavity leg portion 24, acts to draw the solder upwardly so that the retaining member 34 becomes soldered to the plating on the interior wall of the aperture 14.

Accordingly, there has been disclosed an improved arrangement for securing a body to a support. While an illustrative embodiment has been disclosed herein, it will be apparent to those skilled in the art that various modifications and adaptations to that embodiment are possible, and it is intended that this invention be limited only by the scope of the appended claims.

I claim:

1. An arrangement for securing a body to a support, said support being formed with an aperture, the arrangement comprising:

a post fixed to said body and adapted for insertion into said support aperture, said post having a major longitudinal axis and being formed with a generally planar cavity along a plane containing said axis, said cavity extending through the width of said post and being open on opposite sides of the post: and a generally planar resilient retaining member adapted for containment within said post cavity, the retaining member having a maximum dimension along its length which is greater than the width of the post along the cavity and greater than the corresponding internal dimension of the aperture so that when said retaining member is inserted in said post cavity it extends outwardly beyond both ends of the post cavity, the outwardly extending portions of the retaining member being angled away from the post in a direction opposite to the direction of insertion ,of the post into the aperture and terminating in sharp corners, the retaining member being arranged so that when the post is inserted into the aperture the retaining member is resiliently compressed and its outwardly extending sharp corners engage the walls of the aperture to prevent removal of the post therefrom.

2. The arrangement according to claim 1 wherein said post is cylindrical.

3. The arrangement according to claim 1 wherein said retaining member is formed with a notch between the sharp corners to allow compression of the retaining member substantially within its plane.

4. The arrangement according to claim 1 wherein said body and said post are integrally molded of a plastic material and said retaining member is stamped from flat sheet stock metal.

5. An arrangement for securing a body to a support, said support being formed with an aperture, the arrangement comprising:
- a post fixed to said body and adapted for insertion into said support aperture, said post having a major longitudinal axis and being formed with a generally planar cavity along a plane containing said axis, said cavity being generally U-shaped with two leg portions and a central connecting portion within said plane, the central connecting portion of the cavity being generally parallel to the axis and open along a wall of the post, and a first of the cavity leg portions extending through said post and being open at a wall of the post across the axis from the central connecting portion; and
- a generally U-shaped and planar resilient retaining member adapted for containment within said post cavity, said retaining member having two leg portions and a central connecting portion for insertion into the corresponding leg portions and central connecting portion of the post cavity a first leg portion of the retaining member which is inserted into the first leg portion of the post cavity having a maximum dimension along its length which is greater than the length of the post cavity first leg portion and greater than the corresponding internal dimension of the aperture so that when said retaining member is inserted in said post cavity its first leg portion extends outwardly beyond both ends of the post cavity first leg portion, the outwardly extending portions of the retaining member first leg portion being angled away from the post in a direction opposite to the direction of insertion of the post into the aperture and terminating in sharp corners, the retaining member first leg portion being arranged so that when the post is inserted into the aperture the retaining member first leg portion is resiliently compressed and its outwardly extending sharp corners engage the walls of the aperture to prevent removal of the post therefrom.

6. The arrangement according to claim 5 wherein the other of the cavity leg portions is open at the end of the post remote from the body.

7. The arrangement according to claim 5 wherein said cavity central connecting portion is formed to taper inwardly from the post wall.

8. The arrangement according to claim 5 wherein said post is cylindrical.

9. The arrangement according to claim 5 wherein said retaining member first leg portion is formed with a notch between the sharp corners to allow compression of the retaining member first leg portion substantially within its plane.

10. The arrangement according to claim 5 wherein said body and said post are integrally molded of a plastic material and said retaining member is stamped from flat sheet stock metal.

11. The arrangement according to claim 5 wherein said retaining member is dimensioned for a tight fit around that part of the post which is between the two cavity leg portions.

12. The arrangement according to claim 11 wherein the facing edges of the retaining member leg portions are tapered so that when the retaining member is inserted in the post cavity the retaining member leg portions are spread apart to exert a compressive force to that part of the post which is between the two cavity leg portions.

13. An arrangement for securing a body to a support, said support being formed with an aperture, the arrangement comprising:
- a post fixed to the body and having a longitudinal axis, the post being formed with a cavity lying generally in a plane which contains the axis, the cavity being open on at least one side of the post; and
- a generally planar retaining member formed with a barb and adapted for containment within the post cavity so that the barb extends outwardly from the post through the opening of the cavity, the barb being angled opposite to the direction of insertion of the post into the aperture, and the retaining member being sized so that the post with the retaining member may be inserted into the aperture with the barb engaging a wall of the aperture to resiliently compress the retaining member so that the barbs prevent removal of the post therefrom.

* * * * *

UNITED STATES PATENT AND TRADEMARK OFFICE
CERTIFICATE OF CORRECTION

PATENT NO. : 5,176,349
DATED : January 5, 1993
INVENTOR(S) : Robert L. Bendorf

It is certified that error appears in the above-indentified patent and that said Letters Patent is hereby corrected as shown below:

Claim 5, Column 5, Line 23 - A comma that was between "cavity" and "a" was deleted.

Signed and Sealed this

Eighth Day of March, 1994

Attest:

BRUCE LEHMAN

Attesting Officer

Commissioner of Patents and Trademarks